(12) United States Patent
Fondén et al.

(10) Patent No.: US 7,310,382 B2
(45) Date of Patent: Dec. 18, 2007

(54) LINEARIZED SWITCH-BASED POWER AMPLIFIER

(75) Inventors: Tony Fondén, Spånga (SE); Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 708 days.

(21) Appl. No.: 10/474,726

(22) PCT Filed: Apr. 25, 2002

(86) PCT No.: PCT/SE02/00809

§ 371 (c)(1),
(2), (4) Date: Oct. 14, 2003

(87) PCT Pub. No.: WO02/089322

PCT Pub. Date: Nov. 7, 2002

(65) Prior Publication Data

US 2004/0109512 A1 Jun. 10, 2004

(30) Foreign Application Priority Data

Apr. 26, 2001 (SE) .................................. 0101475

(51) Int. Cl.
*H04K 1/02* (2006.01)

(52) U.S. Cl. ...................... 375/297; 330/149; 332/152; 341/143; 375/242; 375/247; 375/295; 455/114.3

(58) Field of Classification Search ................ 375/143, 375/242, 247, 297; 343/713; 330/2, 149; 341/122, 143
See application file for complete search history.

(56) References Cited

U.S. PATENT DOCUMENTS 4,630,283 A * 12/1986 Schiff .......................... 375/143

(Continued)

FOREIGN PATENT DOCUMENTS

EP          1102409          5/2001

(Continued)

OTHER PUBLICATIONS

Hans Ertl, Johann Kolar, Franz Zach; Basic considerations and topologies of switched-mode assisted linear power amplifiers; Feb. 1977; IEEE Transactions on Industrial Electronics, vol. 44. No. 1; pp. 116-123.*

*Primary Examiner*—David C. Payne
*Assistant Examiner*—Adolf DSouza
(74) *Attorney, Agent, or Firm*—Nixon & Vanderhye, P.C.

(57) ABSTRACT

A power amplifier comprises a level-discretization modulator (210) and a mixing and amplifying stage (225), in combination with a properly designed negative feedback path. The feedback path forms an error compensation loop together with a properly selected forward path. The forward path includes at least the mixing and amplifying stage (225), which provides frequency up-conversion to the radio frequency band and switch-based amplification. The negative feedback path includes a down-conversion mixer (280) for down-conversion to the initial frequency band, and compensates for distortion caused by components of the forward path.

28 Claims, 7 Drawing Sheets

U.S. PATENT DOCUMENTS

| | | | |
|---|---|---|---|
| 5,568,157 A | * 10/1996 | Anderson | 343/713 |
| 5,736,906 A | 4/1998 | Jacobson | |
| 5,945,876 A | 8/1999 | Jones | |
| 5,959,499 A | * 9/1999 | Khan et al. | 330/149 |
| 5,974,089 A | * 10/1999 | Tripathi et al. | 375/247 |
| 5,990,738 A | * 11/1999 | Wright et al. | 330/149 |
| 6,094,458 A | 7/2000 | Hellberg | |
| 6,320,913 B1 | 11/2001 | Nakayama | |

FOREIGN PATENT DOCUMENTS

| | | |
|---|---|---|
| WO | 97/49175 | 12/1997 |
| WO | WO 9819391 | 5/1998 |

* cited by examiner

LINEARIZED SWITCH-BASED POWER AMPLIFIER

This application is the U.S. national phase of international application PCT/SE02/00809, filed Apr. 25, 2002, which designated the U.S.

TECHNICAL FIELD OF THE INVENTION

The present invention generally relates to the field of power amplifiers, and more particularly to linearization techniques for power amplifiers.

BACKGROUND OF THE INVENTION

In cellular base stations, satellite communication systems as well as other communication and broadcasting systems of today, it is often desirable to amplify multiple radio frequency (RF) channels simultaneously in the same power amplifier instead of using a dedicated power amplifier for each channel. However, when using one and the same power amplifier for the simultaneous amplification of multiple FDMA/TDMA (Frequency Division Multiple Access/Time Division Multiple Access) or CDMA (Code Division Multiple Access) channels or when using multi-level linear modulation formats, a high degree of linearity is required so that the phases and amplitudes of all the signal components are preserved in the amplification process.

If the linearity is inadequate, the simultaneously amplified channels cross-modulate, causing interference in these and other channels. The non-linearities manifest themselves as cross-modulation of different components of the signal, leading to leakage of signal energy to undesired channels. In addition, the spectra of the signal components are normally broadened, causing additional interference within the channels or in other channels. In the case of multi-level linear modulation such as QAM (Quadrature Amplitude Modulation), the non-linearities will normally lead to distortion of the constellation diagram.

The two most important properties of a power amplifier are efficiency and linearity. Consequently, the problem of enhancing the linearity must be solved while preserving high amplifier efficiency. Due to the amplitude statistics of complex multi-channel or multi-level signals, the efficiency must be kept high at all amplitude levels in order to provide high average efficiency. An additional complication is that the signals often have wide bandwidth, or wide combined bandwidth, which means that the fluctuations between high and low amplitude levels are fast.

A solution to the combined problem of enhancing linearity and preserving high efficiency has been disclosed by the Applicant in the International Patent Application WO 98/11683 and the corresponding U.S. Pat. No. 6,094,458. The proposed power amplifier uses switching techniques for the power amplification, and is based on a sigma-delta modulator in combination with a mixing and amplifying stage. The sigma-delta modulator includes a quantizer for generating an output signal with a finite number of discrete levels. The fixing and amplifying stage includes a plurality of power switches, the voltages of which are proportional to the levels of the quantizer, and the output signal of the sigma-delta modulator more or less directly controls the power switches via a decoder so as to provide appropriate power amplification. Although the proposed switch-based power amplifier has very high efficiency and can benefit from the high linearity of the sigma-delta modulator, there is still a general demand for power amplifiers with even better linearity characteristics.

U.S. Pat. No. 5,736,906 relates to a power supply modulator circuit for a transmitter. The power modulator circuit is a baseband amplifier with apportioned input impedance, buffered switching of power modules and linearizing feedback.

The International Patent Application WO 98/44626 relates to a pulse modulation power amplifier for the audio frequency range. The power amplifier comprises a pulse modulator, a power amplifier stage for amplifying the modulated signal, the output of which is low-pass filtered to obtain an analog output. The circuit further comprises a negative feedback from the power amplifier stage output to one or several loops feeding into one or several pre-amplifier stages preceding the modulator.

BRIEF SUMMARY

The present technology includes an improved linearization technique for reducing distortion and non-linearities in a switch-based power amplifier and concerns a highly linear power amplifier with excellent stability and with reasonable requirements on the involved power amplifier components.

Linearization of an amplifier circuit is improved for generating power amplified radio frequency signals, while maintaining the possibility to operate the level-discretization modulator of the amplifier on relatively low input signal frequencies. Advantageously there is a provided a transmitter with excellent power amplifier efficiency and linearity.

A first aspect of the concerns a power amplifier comprising a level-discretization modulator and a mixing and amplifying stage, in combination with a properly designed negative feedback path. The feedback path forms an error compensation loop together with a properly selected forward path. The forward path includes at least the mixing and amplifying stage, which provides frequency up-conversion to the radio frequency band and switch-based amplification. The negative feedback path includes a down-conversion mixer for down-conversion to the initial frequency band, and compensates for distortion caused by components of the forward path. The negative feedback action will generally reduce both distortion caused by non-linear steady state impedance of the switches as well as distortion resulting from switching glitches. Preferably, the level-discretization modulator used by the power amplifier is also included in the forward path of the loop so that the feedback path compensates for distortion, such as quantization noise, caused by the modulator.

By performing frequency up-conversion in the forward path of the power amplifier after the level-discretization modulator, the requirements on the level-discretization modulator with regard to the modulator input signal frequency will be quite relaxed, making it possible to operate the modulator on low or intermediate frequencies.

The technology thus solves the combined problem of enhancing linearity and preserving high efficiency in power amplifiers with integrated frequency up-conversion.

Advantageously, the local oscillator clock frequency used for frequency up-conversion and down-conversion is an integer multiple of the modulator clock frequency.

For efficient handling of image frequency bands, the feedback path preferably comprises at least one wide-band filter, which is centered around the local oscillator clock frequency and with a bandwidth including both lower and upper information side bands.

A particular advantage is that it is possible to allow more non-linearity in the switch stage, since the negative feedback enables suppression of the distortion caused by non-linearities in the switches. Thus, somewhat slower switches can be used, which means that less expensive switch technologies are available.

Another related aspect of the technology concerns an implementation using a digital modulator. In such a case, the feedback signal has to be digitized in an A/D-converter. In order to handle the very short-time, high signal-level glitches caused by non-ideal switching, a wide-band filter is introduced before the A/D-converter in the feedback path for averaging the switching glitches and thus reducing the required sampling frequency and the required dynamic range of the A/D-converter. By using a wide-band filter, a minimum of delay is introduced into the feedback path and hence the stability of the overall system is maintained.

In order to reduce the required dynamic range of the A/D-converter even further, only the error signal representative of the non-idealities of the switch stage is preferably transferred in the analog domain and digitized by the A/D-converter. Hence, most of the feedback goes directly in the digital domain.

The highly linear power amplifier is particularly suitable for use in RF applications with multi-channel or multi-level signals. The technology offers the following advantages:

Enhanced linearity;

Maintained stability and amplifier efficiency;

The level-discretization modulator can operate in a reasonable frequency band;

Reasonable requirements on the A/D-converter required for an implementation using a digital modulator; and Reduced requirements on switch speed, making less expensive switch technologies available.

Other advantages offered by the present technology will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS

Power amplifiers can be found in various applications in many fields of technology such as consumer electronics, radar technology and radio communication. In the following, the invention will be described with reference to a particular application within the field of radio communication. It should though be understood that the invention is not limited thereto, and that other applications are feasible as well.

Figure 1:
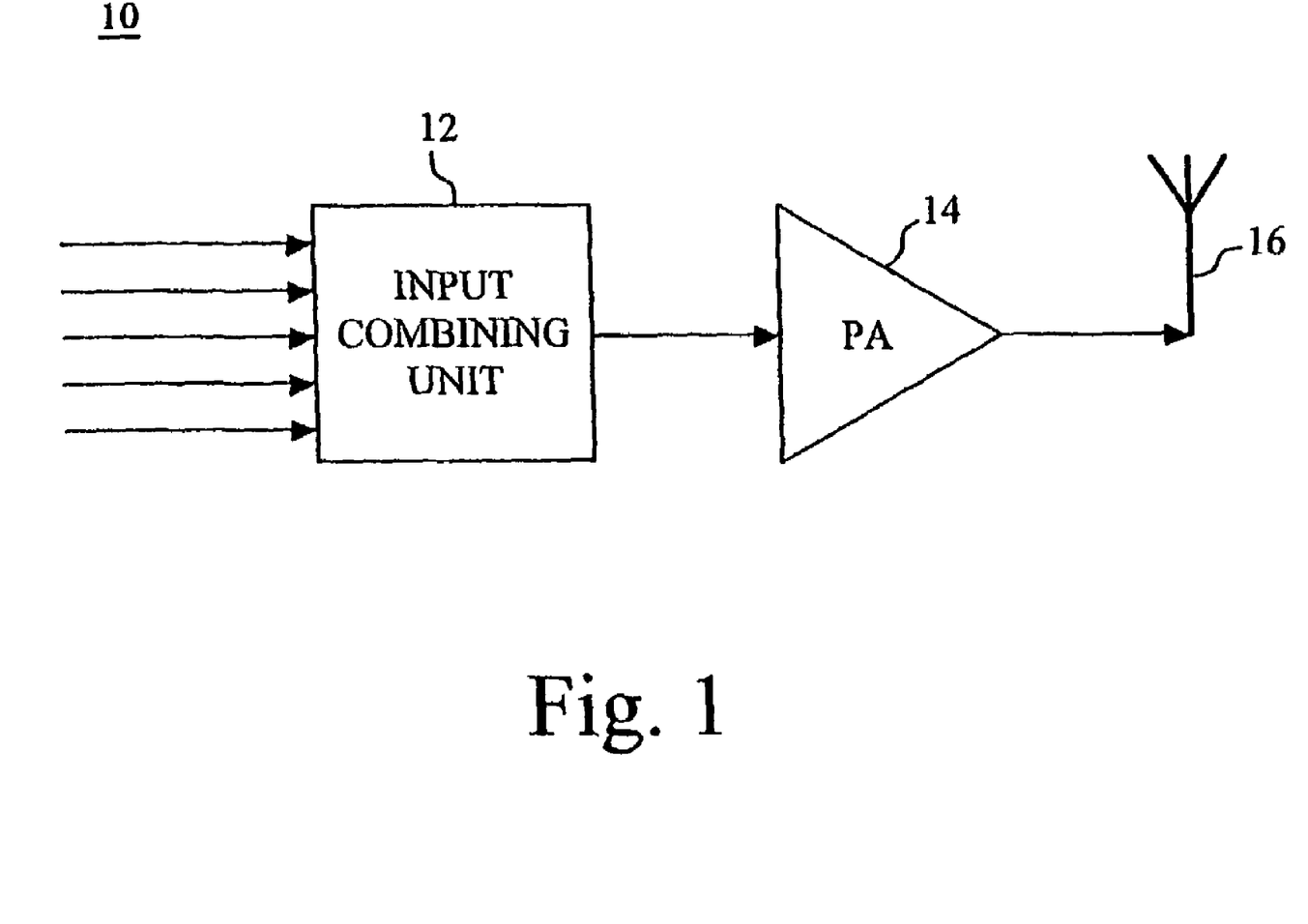
FIG. 1 is a schematic high-level block diagram of a radio transmitter based on a power amplifier.

In a typical radio application, as schematically illustrated in the high-level block diagram of FIG. 1, a power amplifier is arranged in a radio transmitter for simultaneous amplification of several narrow-band channels. In a very basic realization, the transmitter 10 comprises a general input unit 12 for combining the input signals into a complex multi-channel signal, a power amplifier 14 for simultaneous amplification of the multiple channels and a transmission element 16. Such a basic realization of course requires that the input signals are modulated RF signals within the desired target frequency band If the input signals are base-band signals, up-conversion and filtering are also required The transmitter illustrated in FIG. 1 is adapted for amplification and transmission of for example several FDMA/TDMA carrier waves, but can easily be modified for amplification and transmission of a carrier wave on which several CDMA channels are superimposed, or for multi-level linear modulation formats.

As outlined in the background section, complex multi-channel or multi-level signals requires a power amplifier with a high degree of linearity so that the phases and amplitudes of all the signal components are preserved in the amplified output signal. At the same time, a high degree of amplifier efficiency is required. The state-of-the-art solution to the combined problem of enhancing linearity and preserving high efficiency is represented by switch-based power amplifiers using sigma-delta modulation in combination with power switching techniques.

However, a careful analysis by the inventors of the conventional switch-based power amplifiers has revealed that the power switches have a non-negligible effect on the overall linearity of the power amplifier. Ideally, at each point in time, one and only one switch should be closed and have zero "on-impedance", and all the other switches should be open and have infinite "off-impedance". If these conditions are not fulfilled at some point in time, the result will inevitably be undesired energy dissipation and reduced efficiency. However, it has been recognized that non-ideal switching not only affects the amplifier efficiency, but also introduces distortion that will reduce the overall linearity of the power amplifier. The problem can be divided into two parts with different causes. The first is the possible non-zero impedance of the switch in its closed steady state. While a positive on-impedance will always reduce the amplifier efficiency, a non-linear steady-state on-impedance will also introduce distortion. The same applies in principle to the steady-state off-impedance for an open switch, but this is less problematic in practice. The second cause relates to the transition speed of the switch between closed and open states. A finite transition speed of the switches generally results in switching transients, also referred to as switching glitches, that will reduce the efficiency but also introduce distortion.

A necessary requirement for minimizing switching glitches is that the switches are extremely fast compared to the RF period and extremely well synchronized. This severely limits the maximum frequency at which a practical and efficient implementation can be built by today's components. In practical cases, the switch speed required for meeting the usually very strict linearity requirements is much greater than the speed required for making the amplifier sufficiently efficient This means that the requirement on switch speed can be significantly reduced if another form of linearization is devised.

Linearization may be achieved by including the switch stage in the forward path of an error compensation loop, allowing the non-linearities of the switch stage to be compensated for by the feedback action of the loop. This solution reduces both the distortion caused by a non-linear steady-state impedance and distortion caused by switching transients.

A first attempt to solve the linearization problem might be to probe the final output of the amplifier and subtract a version of this signal from the input signal. A problem with this scheme is that the band-pass filter normally included as a final output stage has too large time-delay, since its bandwidth is about as narrow as the noise-shaping bandwidth of the level-discretization modulator. This means that the total feedback system may become unstable, or that very limited distortion reduction can be expected from the system.

At first thought, the bandwidth of the feedback signal should be limited to the signal bandwidth. In that case, the modulator knows what signal is present at the output in the whole relevant frequency range and should be able to adjust the input signal of the quantizer so that the output signal from the power switches is adjusted towards the desired output. However, if the time-delay in the feedback path is non-negligible, the system may become unstable or the performance will be inadequate. Signal theoretical considerations show that the time-delay of a filter is larger than or equal to the order of the inverse of the bandwidth. Thus, it is normally required that any filter in the feedback path actually has a bandwidth that is much larger than the signal bandwidth in order not to introduce too large time-delay.

Figure 2:
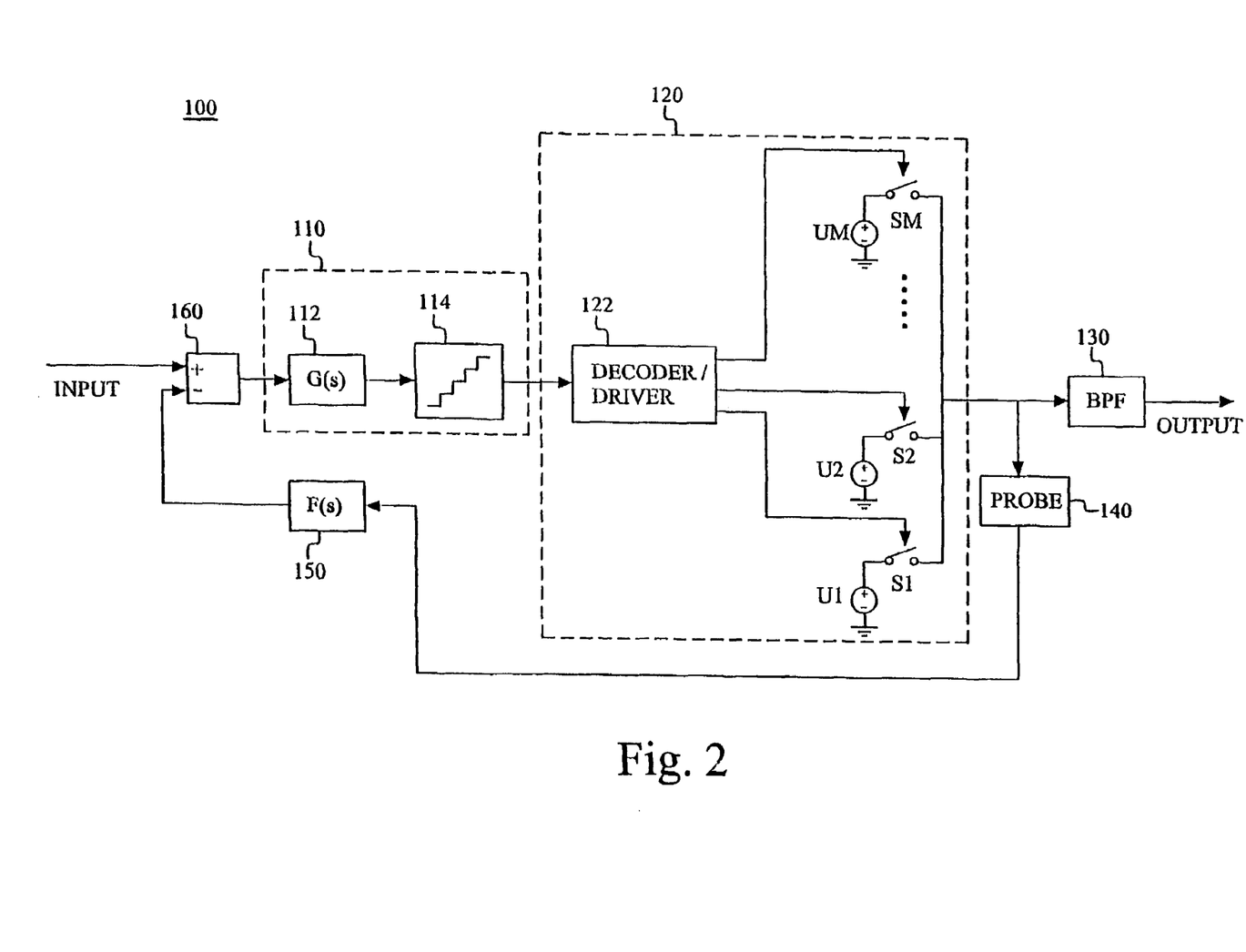
FIG. 2 is a schematic block diagram of a linearized power amplifier.

Therefore, it is better to sense the output signal of the switch stage before the output filter stage and feed the sensed signal back to the input of the power amplifier, as illustrated in FIG. 2.

FIG. 2 is a schematic block diagram of a linearized power amplifier. The power amplifier 100 comprises a level-discretization modulator 110, a switch-based amplifying stage 120, an output filtering stage 130, a feedback probe 140, an optional filter 150 as well as an adder 160. The overall error compensation loop is defined by a forward path, which basically comprises the level-discretization modulator 110 and the switch-based amplifying stage 120, and a negative feedback path for enabling suppression of distortion caused by the modulator 110 and the switch-based amplifying stage 120.

In this particular embodiment, the level-discretization modulator 110 is an analog modulator that converts a continuous input signal into a digital signal having a finite number of discrete levels. The modulator 110 comprises a filter 112 with a response function $G(s)$, and a quantizer 114. The quantizer 114 in the level-discretization modulator 110 converts the filtered signal into a digital signal having M possible discrete levels at points of time given by an internal clock (not shown). It should though be understood that the invention is not limited to this particular type of modulator, and that any level-discretization modulator can be used by the invention.

The switch-based amplifying stage 120 is responsible for the actual amplification and comprises a decoder/driver 122 in association with a number, M, of power switches $S_1$, $S_2$, ..., $S_M$ that are connected to respective voltage sources $U_1$, $U_2$, ..., $U_M$. The digital output signal of the level-discretization modulator 110 controls the power switches via the decoder/driver 122. The voltages $U_1$, $U_2$, ..., $U_M$ are proportional to the levels of the quantizer 114. Ideally, at a given time, one and only one switch is closed in accordance with the signal level of the quantizer output in order to connect the appropriate voltage to the output of the switch stage and thus provide proper power amplification. For example, if the quantizer 114 of the level-discretization modulator 110 outputs the discrete level $v_n$, then switch $S_n$ is closed and all the other switches are open. This means that the voltage at the output of the switch-based amplifying stage 120 will be equal to $U_n$. Although the power switches have been illustrated as connected to voltage sources, the voltage sources can be replaced by current sources with modifications that are obvious to the skilled person.

For additional information on switch-based power amplification, reference is made to the International Patent Application WO 98/11683 and the corresponding U.S. Pat. No. 6,094,458.

The output signal of the switch-based amplifying stage 120, which is also the output of the forward path of the error compensation loop, is sensed by the probe 140 and fed back to the adder 160 at the input of the power amplifier, thus completing the loop. In order to provide the necessary feedback action, the adder 160 subtracts the feedback signal from the input signal. Any distortion within the pass-band of the overall loop filter, taking the response of the involved filters and components including the linearized response of the quantizer 114 into account, will be reduced by the feedback action of the error compensation loop.

Since the output signal of the switch-based amplifying stage 120 acts as input to the output filtering stage 130 of the power amplifier, it is important that the feedback probe 140 is capable of sensing the output voltage from the power switches without causing any significant reduction of the signal power or introducing any disturbances in the output voltage. For this reason, the probe 140 is generally realized as a high-impedance probe. The filtering stage 130 is generally in form of a band-pass filter (BPF) with a pass-band that preferably includes only frequencies that are well within the pass-band of the overall loop filter.

However, it may be difficult or even practically unfeasible to operate the level-discretization modulator on high input signal frequencies, such as high radio frequencies (HRF). In order to avoid this problem, frequency up-conversion to the radio frequency band may be integrated into the power amplifier after the level-discretization modulator so that the modulator is allowed to operate in a comfortable frequency range, typically in the baseband or intermediate frequency band. The design of the feedback path in this type of power amplifier with integrated frequency up-conversion however needs some particular attention, requiring a frequency down-conversion mixer in the feedback path for down-conversion to the initial frequency band.

In the following, various preferred embodiments of a power amplifier with integrated frequency up-conversion and a properly designed linearizing feedback will be described with reference to FIGS. 3-6.

Figure 3:
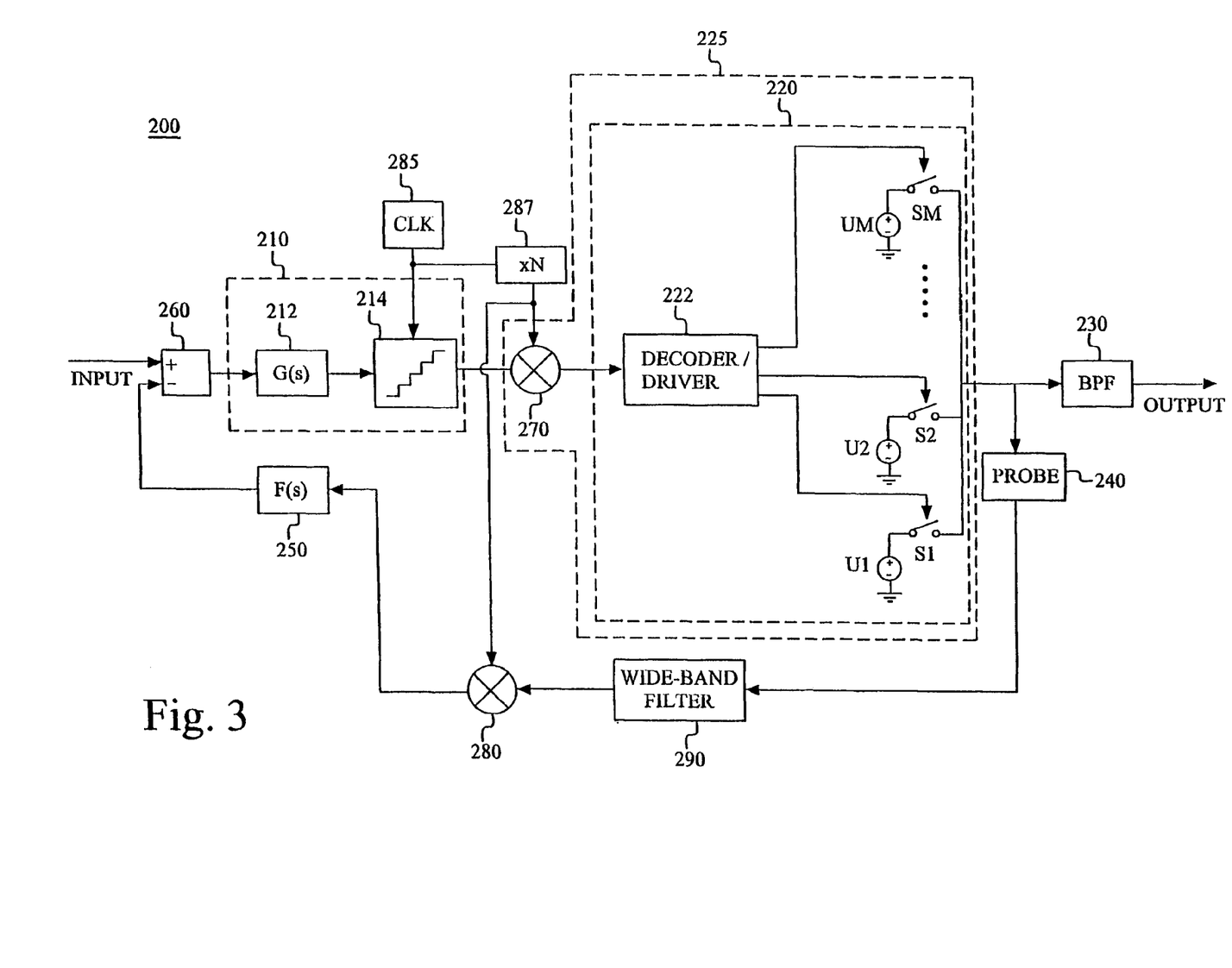
FIG. 3 is a schematic block diagram of a power amplifier according to a preferred example embodiment.

FIG. 3 is a schematic block diagram of a preferred example embodiment of a power amplifier, using frequency up-conversion to the RF domain. The power amplifier 200 is based on a level-discretization modulator 210 and a mixing and amplifying stage 225 formed by an up-conversion mixer 270 in combination with a switch-based amplifying stage 220. The overall error compensation loop is defined by a forward path, which basically comprises the level-discretization modulator 210 and the mixing and amplifying stage 225, and a negative feedback path for enabling suppression of distortion caused by the modulator 210 as well as components in the mixing and amplifying stage 225. The negative feedback path now comprises a down-conversion mixer 280 for down-conversion to the initial frequency band of the modulator input signals. The up-conversion mixer 270 and the down-conversion mixer 280 are controlled by a local oscillator clock, which is preferably produced by a frequency multiplier 287 fed by the main oscillator 285 of the power amplifier circuit. The main oscillator 285 also distributes the fundamental clock to the quantizer 214 of the modulator 210. Naturally, the clock frequency for the analog level-discretization modulator 210 is lower than for realizations without up-conversion. If the local oscillator clock frequency is an integer multiple of the fundamental clock frequency of the main oscillator, the local oscillator signal can be a simple two-level signal without any distortion being introduced. The quantizer generally produces a lot of extra signal replica in different frequency regions of the quantizer output. The advantage of using the local oscillator clock frequency as an integer multiple (xN) of the fundamental clock frequency, is that in-mixing of the replica by harmonic and image mixing in the mixer will occur in such a way that the final output signal is not distorted. This holds true both for up-conversion and down-conversion, since the local oscillator signal is the same for both mixers.

It is possible to use a non-integer frequency ratio, but then special care has to be taken in order not to distort the final output signal.

In order to protect the down-conversion mixer from high-level signals such as switching glitches caused by the switch-based amplifying stage 220, a wide-band filter 290 is preferably introduced in the feedback path. It is important to note the linearity of the overall system is dependent on good linearity of the down-conversion mixer, since distortion caused by the down-conversion mixer is not compensated for by the feedback. The introduction of the wide-band filter 290 helps maintaining the linearity by reducing the bandwidth and dynamic range of the input signal to the down-conversion mixer 280. In order to maintain the stability of the overall feedback system, it is important that the wide-band filter 290 has a relatively small time-delay.

For an implementation with up-conversion it is worthwhile to discuss the image frequency bands. If a band-pass modulator is used, the output filtering stage of the power amplifier will easily filter out the image frequency bands. Also, the wide-band filter or filters provided in the negative feedback path of the error compensation loop will assist in filtering these frequency bands out. In fact, the image frequency bands are generally not a problem if the information signal is rather close to the center of a particular image (Nyquist zone). The situation is however different if the information signal band is closer to the edge of the Nyquist zone (closer to an integer multiple of half the modulator clock frequency). Consider as an example a low-pass modulator. The output filtering stage now has to be very narrow-banded to filter away the image bands. The wide-band filter in the overall feedback path should then preferably be centered around the local oscillator frequency (supposed to be an integer multiple of the modulator clock frequency), and at least of such a wide bandwidth that it includes both the full lower and the full upper information side bands. The down-converted signal will then be correct.

Alternatively, the image problem can be handled by cancellation of the non-wanted side-bands using quadrature input signals to two parallel modulating and switching units, and combining the output signals of the parallel units before or after the output filtering stage. A slightly different variant is not directed at canceling the side bands, but rather to use them as two linearly independent channels in a traditional "I and Q" (in-phase and quadrature-phase) approach. For the skilled person a lot of different implementations of the linearized power amplifier are then immediately obvious.

The basic realization of FIG. 3 gives a practically working linearized power amplifier if an analog level-discretization modulator is used. However, for an implementation using a digital modulator, the feedback signal has to be digitized in an analog-to-digital converter (A/D-converter). The non-ideal switching of the switch stage often creates very short time, high signal-level glitches. In order to digitize the switching glitches, an A/D-converter with extremely high sampling frequency and very high dynamic range is generally required. The wide-band filter introduced in the feedback path normally handles this problem.

Figure 4:
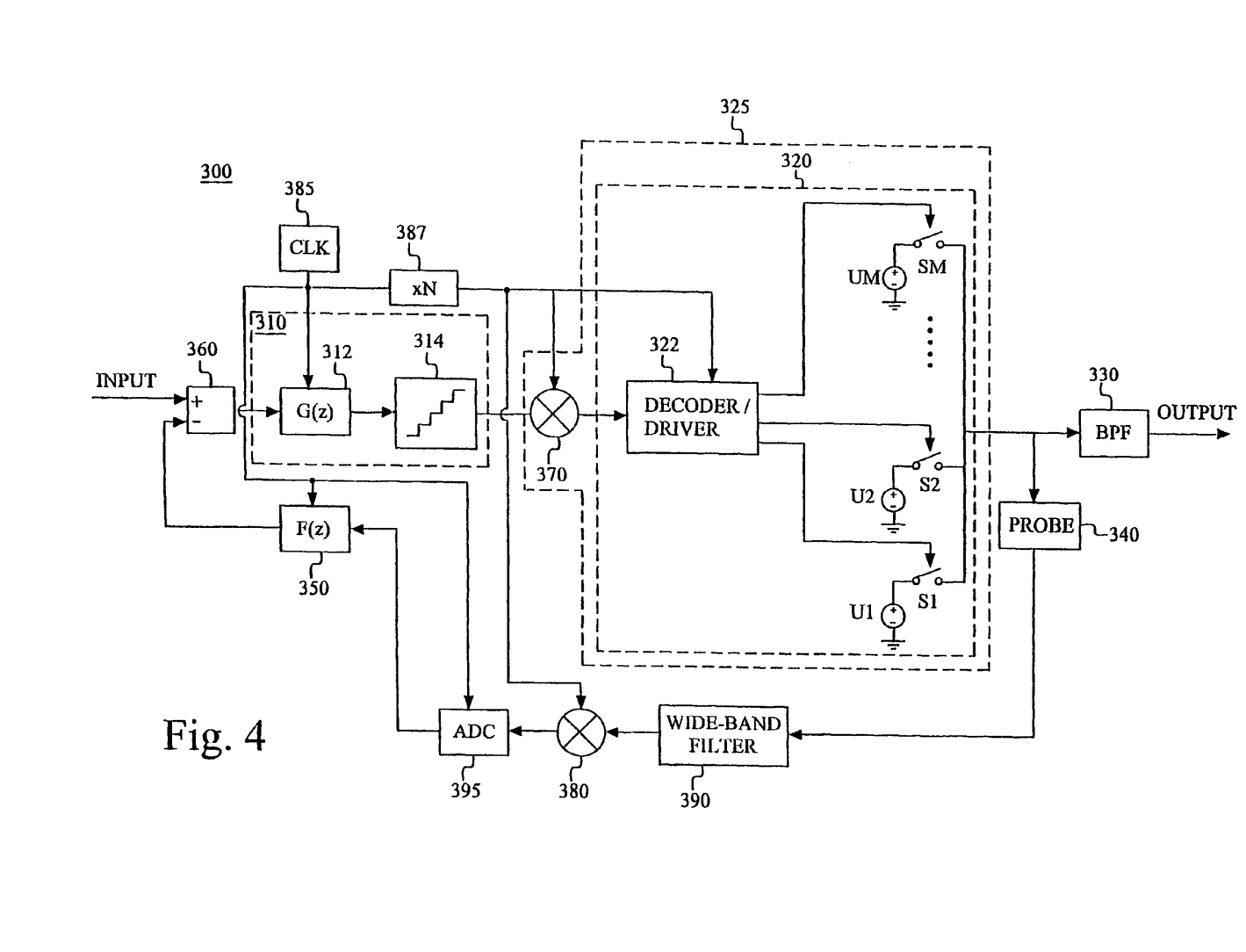
FIG. 4 is a schematic block diagram of a power amplifier according to another preferred example embodiment.

FIG. 4 is a schematic block diagram of a power amplifier according to another preferred example embodiment. The power amplifier of FIG. 4 is similar to that of FIG. 3, except for an A/D-converter in the feedback path, and the level-discretization modulator being digital rather than analog. The clock signal distribution is only included in FIG. 4 to schematically illustrate which components that are using the fundamental clock frequency and which components that are using the local oscillator clock frequency. In practice, standard engineering practice has to be used to tailor the clock signal to each component, for example to minimize time-delay and at the same time eliminate the risk for set-up time violations and hold time violations. The digital level-discretization modulator 310 is generally operable for converting a relatively large number of discrete levels to a smaller number of discrete levels. Compared to an analog modulator, the main difference is that the filter 312 (response function G(z)) of the digital modulator 310 is clocked by an internal clock, while the quantizer 314 is not. The use of a digital modulator means that the signal sensed at the output of the switch-based amplifying stage 320 now has to go through an A/D-converter 395 provided in the feedback path.

In order to reduce the required bandwidth and dynamic range of the A/D-converter 395, a wide-band filter 390 is placed in the input path of the A/D-converter, preferably before the down-conversion mixer 380, for removing high-frequency components of the switching glitches. Accordingly, the glitches are averaged out and the required dynamic range of the A/D-converter 395 is significantly reduced, since the converter now does not have to resolve the full glitch. Furthermore, the use of the wide-band filter 390 also reduces the required sampling rate of the A/D-converter. For instance, if the bandwidth of the filter 390 is half the clock frequency of the level-discretization modulator 310, the A/D-converter 395 can sample at that same frequency. In order to maintain the stability of the overall feedback system, the A/D-converter 395 as well as the wide-band filter 390 should have small time-delays. In this respect, a suitable type of converter to be used in the feedback path may be a so-called fast flash A/D-converter. The filter 390 may be a low-pass or band-pass filter with a relatively large bandwidth, making the corresponding time-delay rather small.

Although the embodiment of FIG. 4 provides a practical realization when a digital modulator is used, the demands on the A/D-converter are still relatively tough. In general, the dynamic range of the A/D-converter has to be larger than that of the information signal.

A further reduction of the required dynamic range of the A/D-converter may be obtained by extracting the error signal that represents the distortion of the switch-based amplifying stage from the output signal of the switch-based amplifying stage and digitizing only the error signal in the A/D-converter. This significantly reduces the required dynamic range of the A/D-converter, allowing a rather low dynamic range A/D-converter to be used and making wideband and small latency designs feasible. A practical realization of such a reduction of the dynamic range will now be described with reference to FIG. 5.

Figure 5:
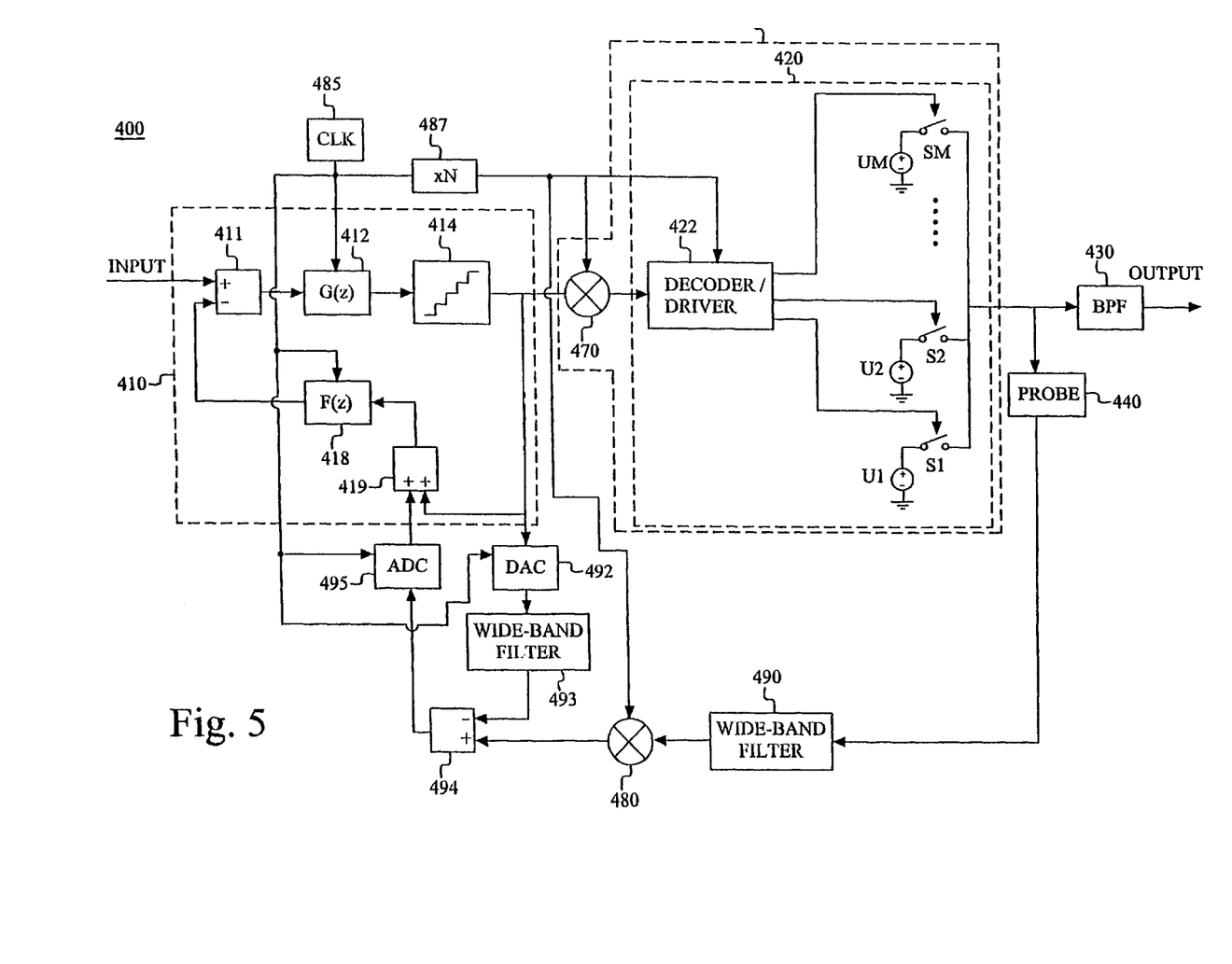
FIG. 5 is a schematic block diagram of a power amplifier according to yet another preferred example embodiment.

FIG. 5 is a schematic block diagram of yet another preferred example embodiment. In this realization, the level-discretization modulator 410 of the power amplifier 400 is preferably a digital sigma-delta modulator, with an internal feedback path entirely in the digital domain for suppression of quantization noise. The sigma-delta modulator 410 basically comprises a filter 412 with response function G(z), a quantizer 414, and an internal feedback path. The internal feedback path of the modulator preferably has a filter 418 with response function F(z). Furthermore, the power amplifier 400 is configured with an arrangement for extracting an error signal, which represents the distortion introduced by the power switches, from the output signal of the switch-based amplifying stage 420. This arrangement basically comprises a digital-to-analog converter (D/A-converter) 492 for converting the output signal of the sigma-delta modulator 410 into the analog domain, a second wide-band filter 493 for filtering the output of the D/A-converter 492 and an adder/subtractor 494 for subtracting the output of the second filter 493 from the output of the down-conversion mixer 480, thus extracting the error signal. The error signal is then converted in an A/D-converter 495 of relatively low dynamic range and added into the internal feedback loop of the sigma-delta modulator 410 by means of a digital adder 419. The wide-band filters 490 and 492 should be matched as closely as possible in order to subtract the signal part that is not distorted by the switching to as large an extent as possible prior to the A/D-conversion. As can be seen from FIG. 5, most of the feedback goes entirely in the digital domain in the internal feedback path of the sigma-delta modulator 410, whereas only the error signal of the switch stage goes in the analog domain.

Figure 6:
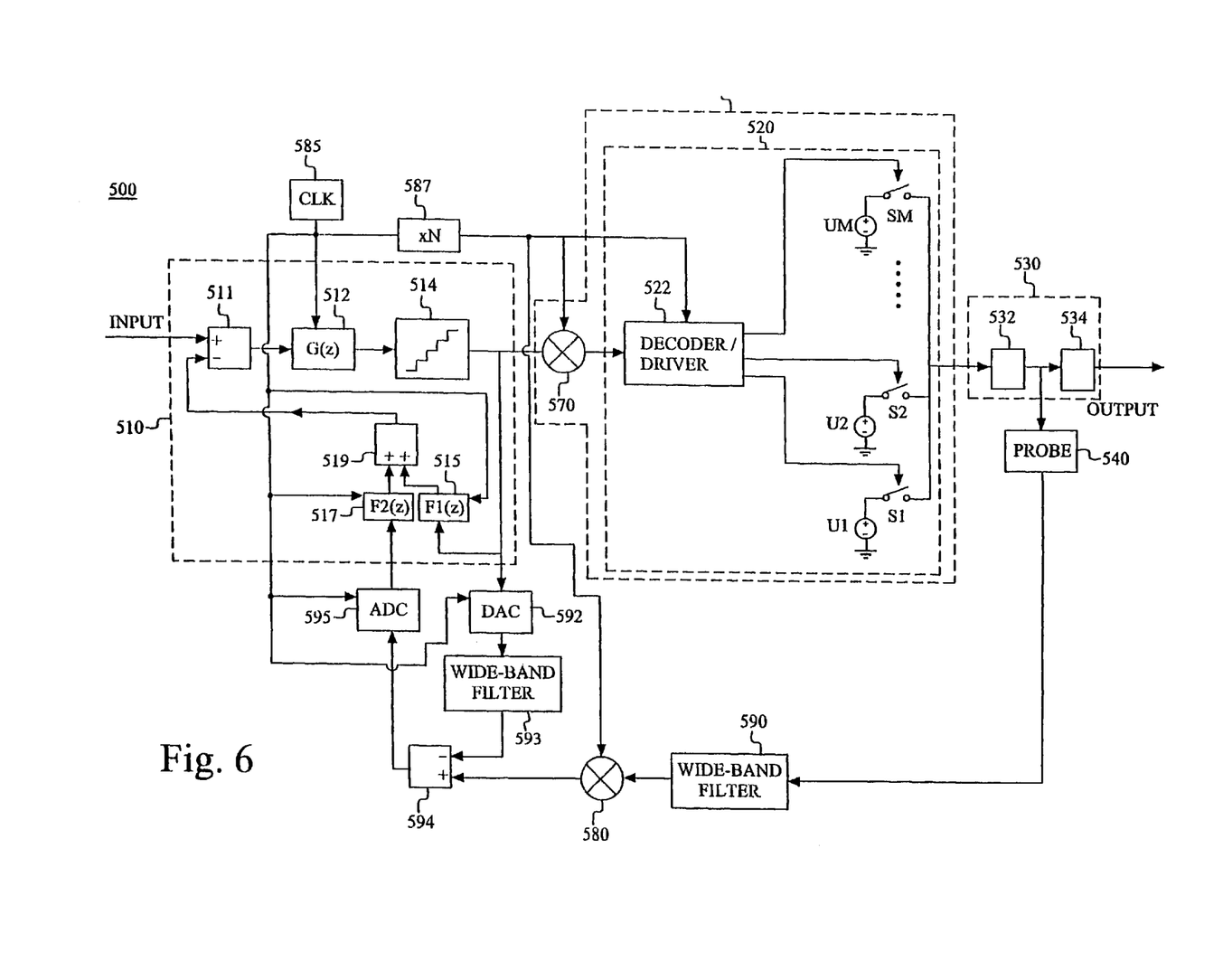
FIG. 6 illustrates the possibility to include a part of the output filtering stage in the error compensation loop of a power amplifier.

FIG. 6 illustrates the possibility to include a part of the output filtering stage in the error compensation loop of the power amplifier. The power amplifier of FIG. 6 is identical to that of FIG. 5 except for the filtering stage 530 and the sigma-delta filters 515 and 517. In this particular embodiment, the output filtering stage 530 comprises two separate units 532, 534. The first filtering unit 532, which has a relatively wide bandwidth, is included in the error compensation loop, while the second filtering unit 534 is arranged outside the loop. The inclusion of the filtering unit 532 in the error compensation loop is compensated for by modifying the filter 418 (F(z)) of FIG. 5, splitting that filter into two different parallel filters 515 (F1(z)) and 517 (F2(z)) that are arranged for receiving the signals from the quantizer 514 and the A/D-converter 595, respectively. Preferably, the wide-band filter 593 (low-pass or band-pass) is matched to the cascade connection of the filtering unit 532 and the wide-band filter 590 (low-pass or band-pass).

Naturally, the inclusion of at least part of the output filtering stage in the error compensation loop is applicable also for a power amplifier with an analog level-discretization modulator.

It should be understood that the invention is not limited to the mixing and amplifying stage illustrated in FIGS. 3-6. In an alternative implementation, the up-conversion takes place "in" the power switches. The local oscillator signal is then introduced in the high-power path by replacing the constant voltages U1, U2, . . . UM with alternating voltage sources (or current sources). The frequency up-conversion in the forward path may thus take place before the amplification or together with the amplification, or possibly even after the amplification.

If a highly linear level-discretization modulator is used, it may be sufficient to provide the mixing and amplifying stage, or the switch-based amplifying stage alone, with an internal feedback path from the output to the input of the stage to enable suppression of distortion caused by non-linearities of the switches.

Figure 7:
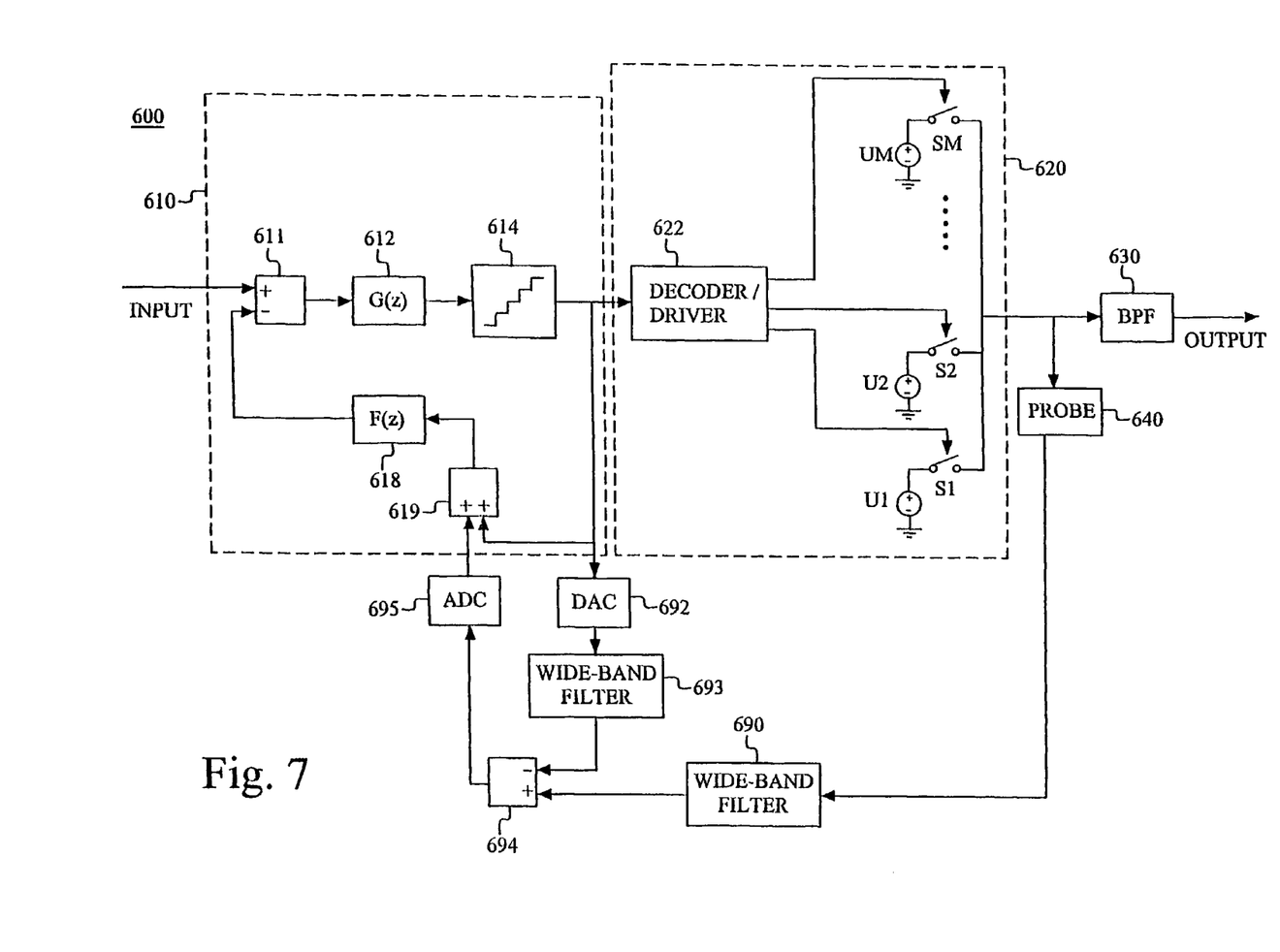

The measures for reducing the required dynamic range of the A/D-converter when using a digital modulator can be used independently of frequency up-conversion in the forward path and down-conversion in the feedback path, as schematically illustrated in FIG. 7. The power amplifier of FIG. 7 is based on a digital modulator 610 such as a sigma-delta modulator, in series with a switch-based amplifying stage 620, an output filtering stage 630. The feedback path basically comprises a feedback probe 640, a wide-band filter 690, and an A/D-converter 695. The wide-band filter 690 introduced before the A/D-converter in the feedback path handles the very short-time, high signal-level glitches caused by non-ideal switching by averaging the switching glitches, thus reducing the required sampling frequency and the required dynamic range of the A/D-converter. By using a wide-band filter, a minimum of delay is introduced into the feedback path and hence the stability of the overall system is maintained.

In order to reduce the required dynamic range of the A/D-converter 695 even further, only the error signal representative of the non-idealities of the switch stage is preferably transferred in the analog domain and digitized by the A/D-converter. The power amplifier 600 is therefore configured with an arrangement for extracting the error signal, which represents the distortion introduced by the power switches, from the output signal of the switch-based amplifying stage 620. This arrangement basically comprises a digital-to-analog converter (D/A-converter) 692 for converting the output signal of the sigma-delta modulator 610 into the analog domain, a second wide-band filter 693 for filtering the output of the D/A-converter 692 and an adder/subtractor 694 for subtracting the output of the second filter 693 from the output of the first wide-band filter 690, thus extracting the error signal. The error signal is then converted in the A/D-converter 695, which may be of relatively low dynamic range, and added into the internal feedback loop of the sigma-delta modulator 610 by means of a digital adder 619. Hence, most of the feedback goes directly in the digital domain. The wide-band filters 690 and 692 are preferably matched.

It is normally recommendable to use a band-pass filter of relatively wide bandwidth in the feedback path when the output signal is up-converted to radio frequency, and to use a wide-band low-pass filter when the output signal is not up-converted. It should however be understood that the boundary between low-pass and band-pass filters is quite vague, and that the skilled person has to adapt the filter properties of the so-called wide-band filters according to the particular application.

The embodiments described above are merely given as examples, and it should be understood that the present invention is not limited thereto. Further modifications, changes and improvements which retain the basic underlying principles disclosed and claimed herein are within the scope and spirit of the invention.

What is claimed is:

1. A power amplifier comprising:
   a level-discretization modulator in series with a mixing and amplifying stage for frequency up-conversion to radio frequency and for switch-based amplification;
   an error compensation loop comprising:
      a forward path including at least said mixing and amplifying stage;
      a negative feedback path configured to generate a feedback signal, said negative feedback path comprising a frequency down-conversion mixer for down-conversion to an initial frequency band; and
      a subtractor arranged to subtract the feedback signal from an input signal of said forward path to provide negative feedback action for enabling suppression of distortion caused by components of said forward path; and
      wherein said level-discretization modulator is digital, said forward path further comprises said digital modulator and said feedback path further comprises an A/D-converter and a first wide-band filter arranged before said A/D-converter for filtering the output signal of said forward path in order to average switching glitches from said switch-based amplifying stage, said first wide-band filter having a bandwidth larger than the bandwidth of the input signal to said power amplifier.

2. The power amplifier according to claim 1, wherein a local oscillator clock frequency used for up-conversion and down-conversion is an integer multiple of a modulator clock frequency.

3. The power amplifier according to claim 1, wherein said wide-band filter is centered around a local oscillator clock frequency and has a bandwidth including both lower and upper information side bands.

4. The power amplifier according to claim 1, further comprising means for extracting an error signal representing distortion of said switch-based amplifying stage from the output signal of said forward path, and wherein said A/D-converter is arranged for digitizing said error signal.

5. The power amplifier according to claim 4, wherein said level-discretization modulator comprises a sigma-delta modulator having an internal feedback loop, and said feedback path further comprises means for adding said digitized error signal into the internal feedback loop of said sigma-delta modulator.

6. The power amplifier according to claim 5, wherein said means for extracting an error signal comprises:
   said first wide-band filter provided in said feedback path for filtering the output signal of said forward path;
   a D/A-converter for converting an output signal of said modulator into analog form;
   a second wide-band filter, matching said first wide-band filter, for filtering an analog sigma-delta output signal; and
   a second subtractor for subtracting a filtered output signal of said second wide-band filter from a filtered output signal of said first wide-band filter to generate said error signal.

7. The power amplifier according to claim 4, wherein only the error signal representing the distortion of said switch-based amplifying stage goes in the analog domain, and the remaining part of the feedback goes in the digital domain.

8. The power amplifier according to claim 1, wherein said forward path further comprises at least part of a filtering stage connected after said amplifying stage.

9. The power amplifier according to claim 8, wherein said filtering stage is divided into a number of filtering units, and said forward path comprises at least one of said filtering units.

10. The power amplifier according to claim 1, wherein said feedback path comprises a high-impedance probe for extracting an output signal of said forward path.

11. The power amplifier according to claim 1, wherein said mixing and amplifying stage includes a frequency up-conversion mixer and a switch-based amplifying stage.

12. The power amplifier according to claim 11, wherein said switch-based amplifying stage comprises a decoder in connection with a plurality of power switches.

13. A transmitter comprising:
   a power amplifier comprising:
      a level-discretization modulator in series with a mixing and amplifying stage for frequency up-conversion to radio frequency and for switch-based amplification
      a loop comprising:
         a forward path including at least said mixing and amplifying stage;
         a negative feedback path comprising a frequency down-conversion mixer for down-conversion to the initial frequency band; and
   a subtractor configured to subtract the feedback signal from an input signal of said forward path to provide negative feedback action for enabling suppression of distortion caused by components of said forward path; and
         wherein said level-discretization modulator is digital, said forward path further comprises said digital modulator and said feedback path further comprises an A/D-converter and a first wide-band filter arranged before said A/D-converter for filtering the output signal of said forward path in order to average switching glitches from said switch-based amplifying stage, said first wide-band filter having a bandwidth larger than the bandwidth of the input signal to said power amplifier.

14. The transmitter according to claim 13, wherein an local oscillator clock frequency used for up-conversion and down-conversion is an integer multiple of a modulator clock frequency.

15. The transmitter according to claim 13, wherein said wide-band filter is centered around the local oscillator clock frequency and has a bandwidth including both lower and upper information side bands.

16. The transmitter according to claim 13, wherein said power amplifier further comprises means for extracting an error signal representing distortion of said switch-based amplifying stage from the output signal of said forward path, and said A/D-converter is arranged for digitizing said error signal.

17. The transmitter according to claim 16, wherein said level-discretization modulator is a sigma-delta modulator having an internal feedback loop, and said feedback path further comprises means for adding said digitized error signal into the internal feedback loop of said sigma-delta modulator.

18. The transmitter according to claim 17, wherein said means for extracting an error signal comprises:
   said first wide-band filter provided in said feedback path for filtering the output signal of said forward path;
   a D/A-converter for converting the output signal of said modulator into analog form;
   a second wide-band filter, matching said first wide-band filter, for filtering an analog sigma-delta output signal; and a second subtractor for subtracting a filtered output signal of said second wide-band filter from a filtered output signal of said first wide-band filter to generate said error signal.

19. The transmitter according to claim 16, wherein only the error signal representing the distortion of said switch-based amplifying stage goes in the analog domain, and the remaining part of the feedback goes in the digital domain.

20. The transmitter according to claim 13, wherein said forward path further comprises at least part of a filtering stage connected after said amplifying stage.

21. The transmitter according to claim 20, wherein said filtering stage is divided into a number of filtering units, and said forward path comprises at least one of said filtering units.

22. The transmitter according to claim 13, wherein said feedback path comprises a high-impedance probe for extracting an output signal of said forward path.

23. The transmitter according to claim 13, wherein said mixing and amplifying stage includes a frequency up-conversion mixer and a switch-based amplifying stage.

24. The transmitter according to claim 23, wherein said switch-based amplifying stage comprises a decoder in connection with a plurality of power switches.

25. A power amplifier comprising:
a digital level-discretization modulator in series with a switch-based amplifying stage;
an error compensation loop comprising:
a forward path including said level-discretization modulator and said switch-based amplifying stage;
a negative feedback path comprising an A/D-converter and a first wide-band filter arranged before said A/D-converter for filtering the output signal of said forward path in order to average switching glitches from said switch-based amplifying stage, said first wide-band filter having a bandwidth larger than the bandwidth of the input signal to said power amplifier; and
a subtractor configured to subtract the feedback signal from an input signal of said forward path to provide negative feedback action for enabling suppression of distortion caused by said level-discretization modulator and said mixing and amplifying stage.

26. The power amplifier according to claim 25, wherein said power amplifier further comprises means for extracting an error signal representing distortion of said switch-based amplifying stage from an output signal of said forward path, and said A/D-converter is arranged for digitizing said error signal.

27. The power amplifier according to claim 26, wherein said digital level-discretization modulator is a sigma-delta modulator having an internal feedback loop, and said feedback path further comprises means for adding said digitized error signal into the internal feedback loop of said sigma-delta modulator.

28. A power amplifier based on a level-discretization modulator in series with a mixing and amplifying stage for frequency up-conversion to radio frequency and for switch-based amplification, wherein said power amplifier further includes an error compensation loop comprising:
a forward path including at least said mixing and amplifying stage; and
a negative feedback path, said negative feedback path including a frequency down-conversion mixer for down-conversion to the initial frequency band; and
means for subtracting the feedback signal from an input signal of said forward path to provide negative feedback action for enabling suppression of distortion caused by components of said forward path; and
wherein said level-discretization modulator is digital, said forward path further comprises said digital modulator and said feedback path further comprises an A/D-converter and a first wide-band filter arranged before said A/D-converter for filtering the output signal of said forward path in order to average switching glitches from said switch-based amplifying stage; and
wherein said power amplifier further comprises means for extracting an error signal representing the distortion of said switch-based amplifying stage from the output signal of said forward path, and wherein said A/D-converter is arranged for digitizing said error signal; and
wherein said level-discretization modulator is a sigma-delta modulator having an internal feedback loop, and said feedback path further comprises means for adding said digitized error signal into the internal feedback loop of said sigma-delta modulator; and
wherein said means for extracting an error signal comprises:
said first wide-band filter provided in said feedback path for filtering the output signal of said forward path;
a D/A-converter for converting the output signal of said modulator into analog form;
a second wide-band filter, matching said first wide-band filter, for filtering the analog sigma-delta output signal; and
a subtractor for subtracting the filtered output signal of said second wide-band filter from the filtered output signal of said first wide-band filter to generate said error signal.

* * * * *